United States Patent
Setta et al.

(10) Patent No.: US 9,741,564 B2
(45) Date of Patent: Aug. 22, 2017

(54) METHOD OF FORMING MARK PATTERN, RECORDING MEDIUM AND METHOD OF GENERATING MARK DATA

(71) Applicant: Toshiba Memory Corporation, Minato-ku (JP)

(72) Inventors: Yuji Setta, Kuwana (JP); Taketo Kuriyama, Kuwana (JP); Nobuhiro Komine, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/813,466

(22) Filed: Jul. 30, 2015

(65) Prior Publication Data

US 2016/0322307 A1    Nov. 3, 2016

Related U.S. Application Data

(60) Provisional application No. 62/153,732, filed on Apr. 28, 2015.

(51) Int. Cl.
  *G03F 7/20* (2006.01)
  *H01L 21/027* (2006.01)

(52) U.S. Cl.
  CPC ........ *H01L 21/0274* (2013.01); *G03F 7/2002* (2013.01)

(58) Field of Classification Search
  CPC .................................................. G03F 7/2002
  See application file for complete search history.

(56) References Cited

U.S. PATENT DOCUMENTS

| 6,842,225 B1 | 1/2005 | Irie |
| 2011/0227180 A1 | 9/2011 | Murakoshi |
| 2012/0237857 A1* | 9/2012 | Chiu ........................ G03F 1/42 430/5 |

FOREIGN PATENT DOCUMENTS

| JP | 9-320922 | 12/1997 |
| JP | 2002-116315 | 4/2002 |
| JP | 2009-128618 | 6/2009 |
| JP | 2010-278399 | 12/2010 |
| JP | 2011-198966 | 10/2011 |
| JP | 2013-149708 | 8/2013 |
| WO | WO 00/68738 | 11/2000 |

* cited by examiner

*Primary Examiner* — Kathleen Duda
(74) *Attorney, Agent, or Firm* — Oblon, McClelland, Maier & Neustadt, L.L.P.

(57) ABSTRACT

In a method of forming a mark pattern according to the embodiments, a film to be processed on a substrate is coated with a photosensitive film, and the photosensitive film is irradiated with exposure light via a mask. On the mask, a first circuit pattern having a first transmittance and a mark having a second transmittance and used to measure a superposition between films are arranged. By irradiating with the exposure light, a second circuit pattern having a first film thickness and a mark pattern having a second film thickness thinner than the first film thickness are formed on the substrate.

7 Claims, 12 Drawing Sheets

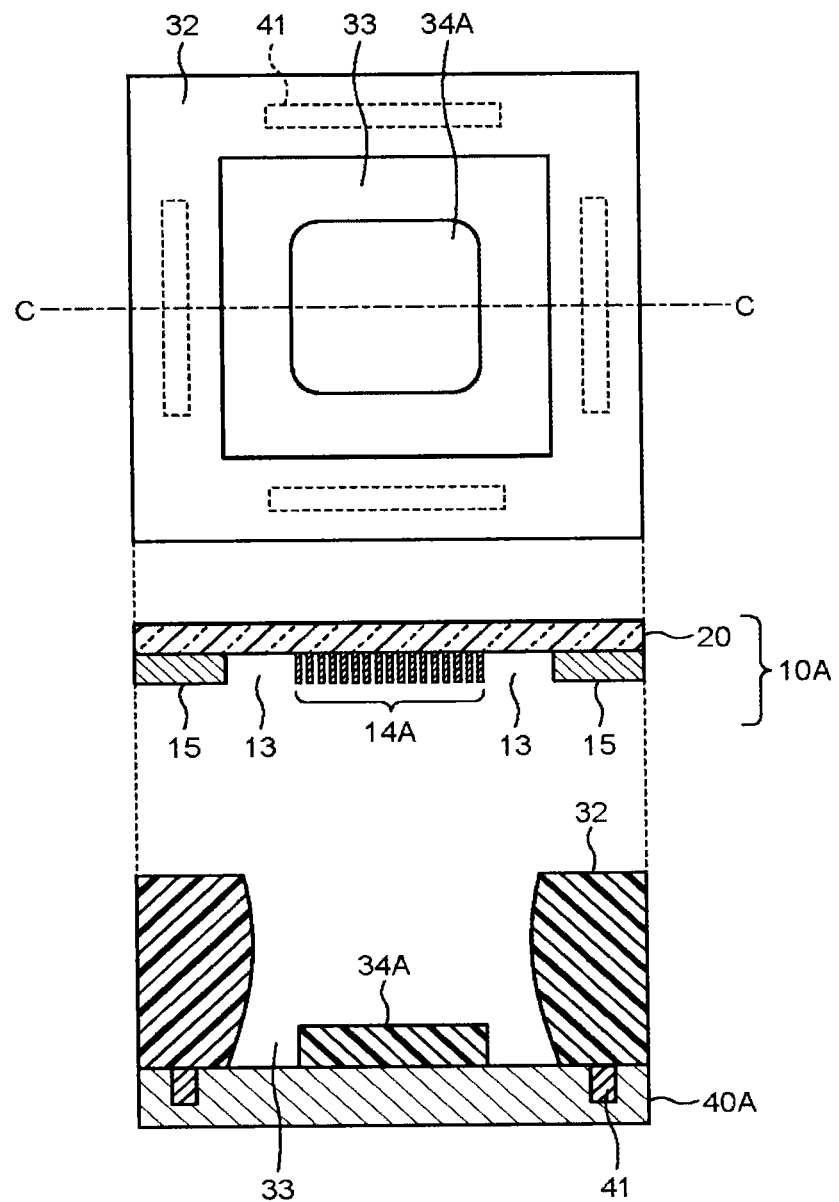

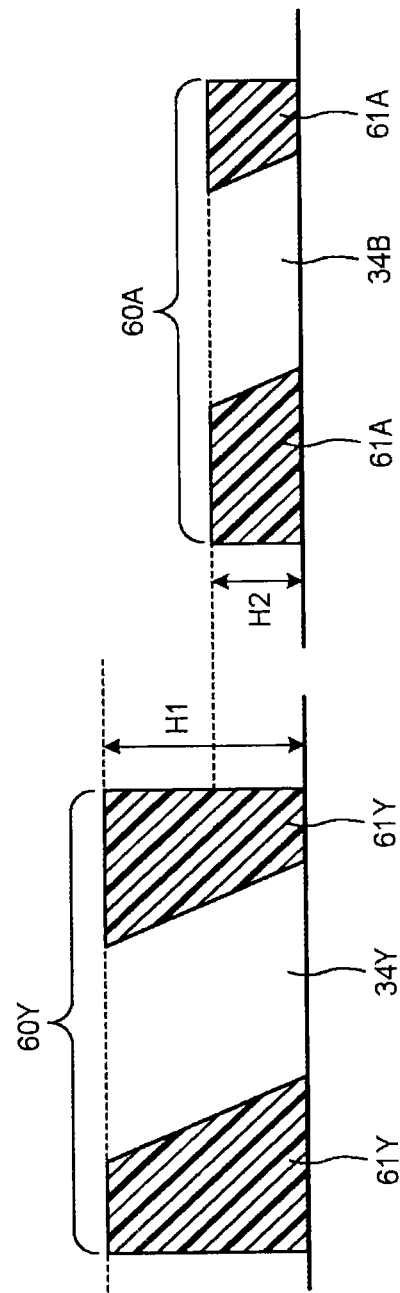

METHOD OF FORMING MARK PATTERN, RECORDING MEDIUM AND METHOD OF GENERATING MARK DATA

CROSS-REFERENCE TO RELATED APPLICATIONS

This application is based upon and claims the benefit of priority from U.S. Provisional Application No. 62/153,732, filed on Apr. 28, 2015; the entire contents of which are incorporated herein by reference.

FIELD

The present embodiment generally relates to a method of forming a mark pattern, a recording medium, and a method of generating mark data.

BACKGROUND

In an exposure process which is one of manufacturing processes of a semiconductor apparatus, a superposition between mark patterns on an upper layer side and a lower layer side is performed. For the superposition, a mark pattern having a symmetrical shape is used.

However, when the exposure is performed relative to a thick film resist, there is a case where a resist pattern to be the mark pattern is formed in an asymmetrical shape according to a surrounding environment. When the superposition between the upper layer side and the lower layer side is measured by using such an asymmetrical resist pattern, the superposition cannot be accurately measured. Therefore, it is desired to easily form a mark pattern having a desired shape.

BRIEF DESCRIPTION OF THE DRAWINGS

FIGS. 4A and 4B are diagrams to describe a superposition between upper and lower layers;

FIG. 7 is a diagram to describe a shape of a mark pattern according to the second embodiment;

DETAILED DESCRIPTION

A method of forming a mark pattern is provided according to the present embodiment. In the method of forming the mark pattern, a photosensitive film is coated on a film to be processed on a substrate. Also, the photosensitive film is irradiated with exposure light via a mask. The mask includes a first mask pattern region having a first transmittance and a second mask pattern region having a second transmittance. A first circuit pattern is arranged on the first mask pattern region, and a mark to be used to measure the superposition between the films is arranged on the second mask pattern region. A second circuit pattern corresponding to the first circuit pattern is formed on the substrate with a first film thickness by being irradiated with the exposure light. Also, a mark pattern corresponding to the mark is formed on the substrate with a second film thickness which is thinner than the first film thickness.

The method of forming the mark pattern, the recording medium, and the method of generating the mark data according to the embodiments will be described below with reference to the drawings. The present invention is not limited to these embodiments.

First Embodiment

Figure 1:
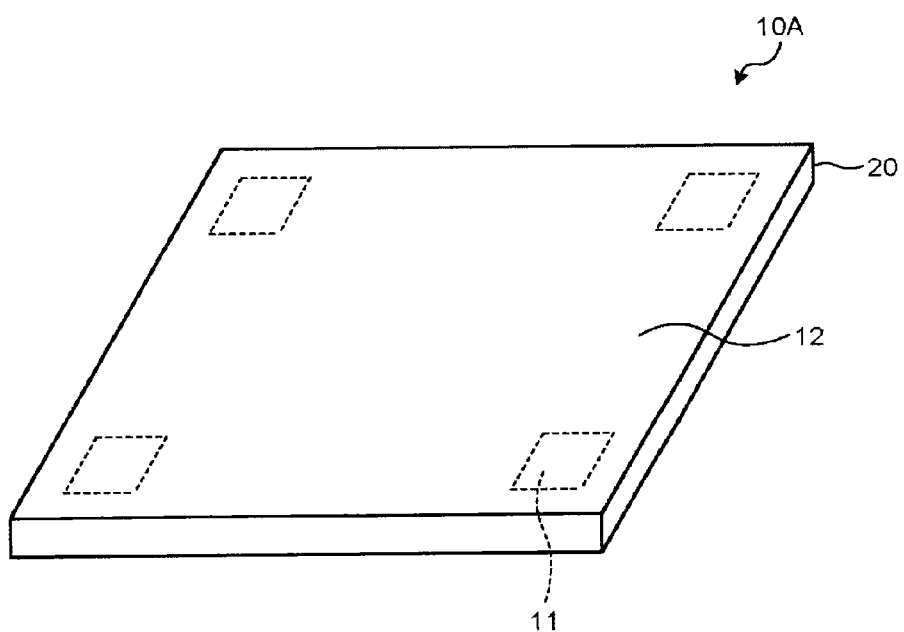
FIG. 1 is a diagram of an outline configuration of a mask according to a first embodiment.

FIG. 1 is a diagram of an outline configuration of a mask according to a first embodiment. In the present embodiment, gray scale lithography (GSL) is applied to a mark pattern used when a gap of a superposition is measured, and a mark pattern is formed with a thinner film than the other resist pattern.

A mask 10A is a photomask to be used in a lithography process for manufacturing a semiconductor apparatus. The mask 10A is formed by using a substrate 20. The substrate 20 is a plate member such as a glass substrate. A mark arranging region 11 and a circuit pattern region 12 are arranged on an upper surface side of the substrate 20.

A mark 14A to be described below is arranged on the mark arranging region 11. Also, a circuit pattern and the like is arranged on the circuit pattern region 12. The mark pattern formed on a wafer by using the mark 14A is used to measure a superposition between films.

The mark pattern on the wafer is a measurement mark for QC management (QC management pattern) to be used when the thick film resist (photosensitive film thicker than a predetermined value) is exposed. Specifically, the mark pattern is an overlay (OL) mark to be used when the gap of the superposition between the mark patterns on the lower layer side and the upper layer side on the wafer is measured. The mark pattern is arranged, for example, in a scribe area near a scribe line on the wafer. The scribe area is an area where a process mark and the like is arranged and an area necessary for cutting out a chip.

In the present embodiment, a case will be described where a mask pattern corresponding to the mask 10A is superposed relative to the mark pattern (pattern on the lower layer side) formed on the wafer. Therefore, a mark pattern to be formed on the wafer by using the mark 14A is a mark pattern on an upper layer side. The mark pattern formed on the mask such as the mask 10A is referred to as the mark 14A below.

Figure 2A:
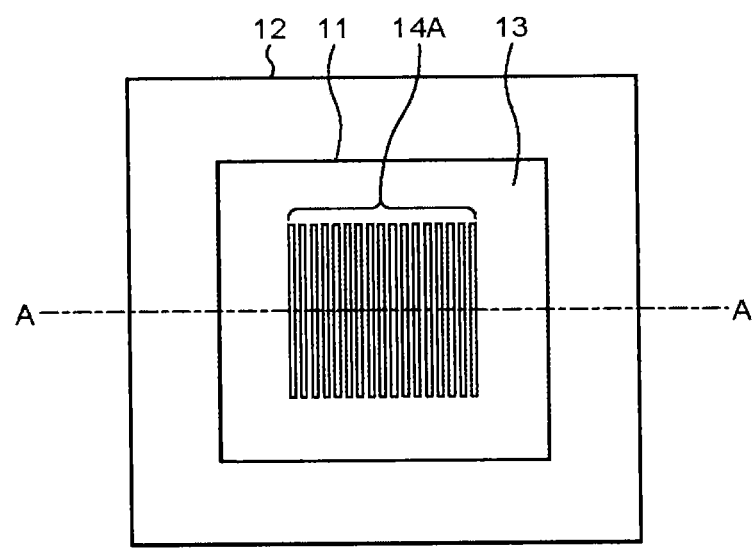
FIGS. 2A and 2B are diagrams of a structure of a mark formed on the mask according to the first embodiment.
Figure 2B:
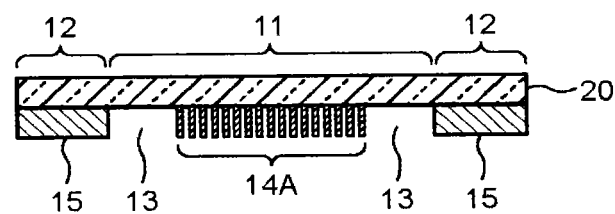

FIGS. 2A and 2B are diagrams of a structure of a mark formed on the mask according to the first embodiment. A configuration of an upper surface of the mark arranging region 11 in the mask 10A is illustrated in FIG. 2A. A configuration of a cross section of the mark arranging region 11 in the mask 10A is illustrated in FIG. 2B. FIG. 2B is a sectional view of an A-A cross section of the configuration illustrated in FIG. 2A.

The mark 14A is arranged in the mark arranging region 11. A region around the mark arranging region 11 is the circuit pattern region 12, and a circuit pattern 15 is arranged on the circuit pattern region 12.

The mark arranging region 11 is a rectangular region such as a square. The mark 14A is arranged in the center part of the mark arranging region 11. Also, a region around the mark 14A is an opening pattern 13 where a pattern is not arranged.

The mark 14A is arranged in a rectangular region such as a square. Also, the opening pattern 13 is formed in a rectangular annular shape. The mark 14A is arranged in a region inside the opening pattern 13, and the circuit pattern region 12 is a region outside the opening pattern 13.

The mark 14A is a pattern in which a pattern occupancy (light shielding portion occupancy) of a light shielding portion (light shielding part) of the mask pattern is adjusted. The pattern occupancy of the mark 14A is adjusted so that the thickness of the mark pattern becomes thinner than that of the circuit pattern and the like when the mark pattern is formed on the wafer. The mark 14A is a pattern occupancy adjusting dummy. A pattern shape of the mark 14A is not transferred on the wafer as it is, and the pattern shape of the mark 14A is transferred on the wafer so as to be thinner than the circuit pattern. When the mask 10A is a transmissive mask, the pattern occupancy of the mark 14A corresponds to a transmittance of the exposure light of the mark 14A. Also, when the mask 10A is a reflective mask, the pattern occupancy of the mark 14A corresponds to a reflectance of the exposure light of the mark 14A.

The mark 14A is, for example, a line and space pattern. In the line and space pattern, a line pattern which is the light shielding portion and a space pattern which is a transmission part are alternately arranged. The mark 14A is not limited to the line and space pattern and may be a mesh pattern and a pillar pattern. The pattern occupancy of the mark 14A is a rate which is an area of the region occupied by the line pattern relative to an area of a square region where the mark 14A is arranged. The pattern occupancy of the mark 14A is determined according to the thickness of the mark pattern to be formed on the wafer.

Figure 3A:
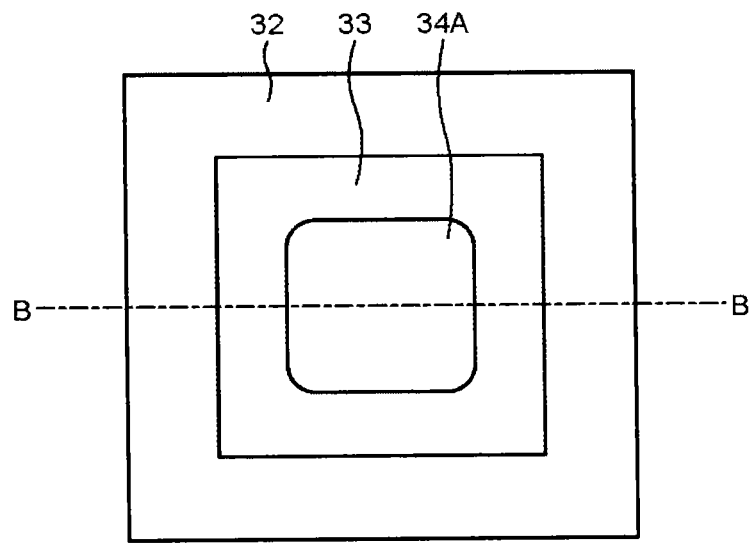
FIGS. 3A and 3B are diagrams of a structure of a mark pattern according to the first embodiment.
Figure 3B:
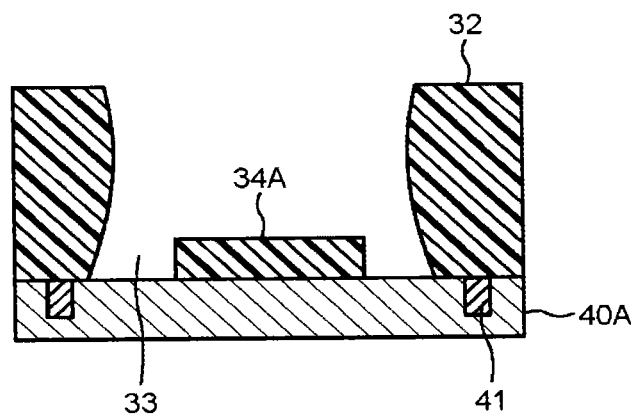

FIGS. 3A and 3B are diagrams of a structure of a mark pattern according to the first embodiment. A configuration of an upper surface of a mark pattern 34A to be formed on a wafer 40A is illustrated in FIG. 3A. A configuration of a cross section of the mark pattern 34A to be formed on the wafer 40A is illustrated in FIG. 3B. FIG. 3B is a sectional view of a B-B cross section of the configuration illustrated in FIG. 3A. The mark pattern 34A formed by using the mark 14A is a pillar pattern having a rectangular upper surface.

In the present embodiment, for example, exposure by using the mask 10A is performed relative to a thick film resist on the wafer 40A. For example, the film thickness of the thick film resist is equal to or more than two micrometer. When the mask 10A is irradiated with the exposure light, the thick film resist on the wafer 40A is irradiated with the exposure light according to the mask pattern of the mask 10A. After that, a resist pattern is formed on the wafer 40A by developing the wafer 40A.

The mark pattern 34A and the circuit pattern 32 are the resist patterns formed on the wafer 40A. The mark pattern 34A on the wafer 40A corresponds to the mark 14A of the mask 10A, and the circuit pattern 32 on the wafer 40A corresponds to the circuit pattern 15 of the mask 10A. Also, an opening pattern 33 on the wafer 40A corresponds to the opening pattern 13 of the mask 10A. Since the pattern occupancy of the mark pattern 34A is adjusted, the thickness of the mark pattern 34A is thinner than that of the circuit pattern 32. Also, since the opening pattern 33 is arranged between the mark pattern 34A and the circuit pattern 32, the mark pattern 34A is insulated from the circuit pattern 32.

A mark pattern 41 on a lower layer side is formed on the wafer 40A, and the mark pattern 34A on the upper layer side is superposed and measured relative to the mark pattern 41 on the lower layer side. The mark pattern 41 on the lower layer side is a pattern formed by lithography processing before the lithography processing performed by using the mask 10A. The mark pattern 34A on the upper layer side is a pattern formed by the lithography processing performed by using the mask 10A.

In the lithography processing using the mask 10A, the exposure processing is performed so as to prevent the deviation of the position of the mark pattern 34A on the upper layer side relative to the mark pattern 41 on the lower layer side. Specifically, the lithography processing (exposure, development, and the like) is performed so that the mark pattern 34A is formed at the center part of the region surrounded by the mark pattern 41 on the lower layer side. In the present embodiment, since the mark pattern 34A is thinner than the circuit pattern 32, the mark pattern 34A has a symmetrical shape corresponding to the mark 14A.

Figure 4B:
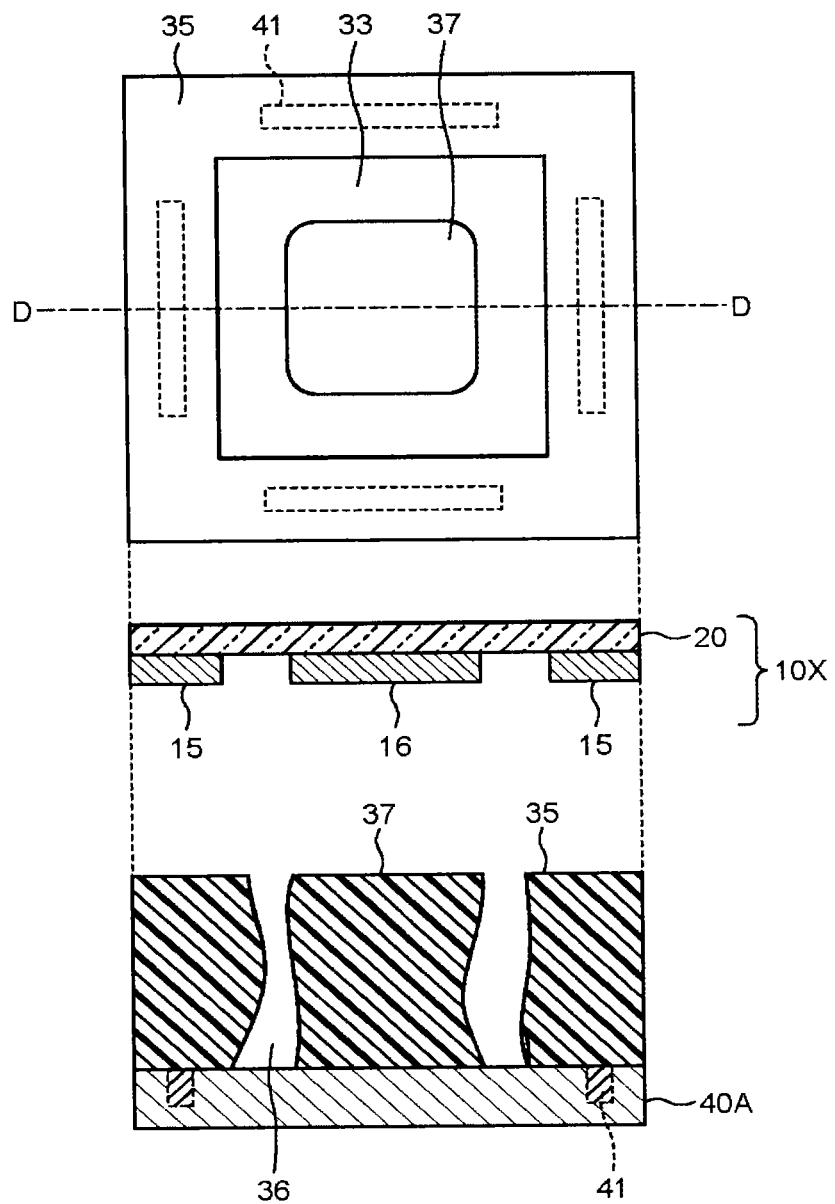

Next, a structure of the mark pattern 34A and the superposition between the upper and lower layers according to the embodiment will be described. FIGS. 4A and 4B are diagrams to describe the superposition between the upper and lower layers. The structure of the mark pattern 34A formed by using the mask 10A having the mark 14A is illustrated in FIG. 4A. Also, a structure of a mark pattern 37 formed by using a mask (mask 10X to be described below) which does not have the mark 14A is illustrated in FIG. 4B.

The upper stage of FIG. 4A is a top view of the mark pattern 34A, and the upper stage of FIG. 4B is a top view of the mark pattern 37. The lower stage of FIG. 4A is a sectional view of the mark pattern 34A, and the lower stage of FIG. 4B is a sectional view of the mark pattern 37. Also, the middle stage of FIG. 4A is a sectional view of the mask 10A, and the middle stage of FIG. 4B is a sectional view of the mask 10X. The lower stage of FIG. 4A is a sectional view of a C-C section of the structure illustrated in the upper stage of FIG. 4A, and the lower stage of FIG. 4B is a sectional view of a D-D cross section of the structure illustrated in the upper stage of FIG. 40.

The mark pattern 41 on the lower layer side includes, for example, four line patterns. Each line pattern is arranged at a position of a side of a square. There are gaps at positions of vertexes of the square so that the line pattern does not overlap with each other.

First, a structure of the mark pattern 34A will be described with reference to FIG. 4A. The mark pattern 34A and the opening pattern 33 on the upper layer side are formed on the wafer 40A so as to fit in an inner region (square region) of the four line patterns. Specifically, the mark pattern 34A and the circuit pattern 32 on the upper layer side are formed on the wafer 40A so that the center of the square region is overlapped with the center of the mark pattern 34A and the sides of the square region are in parallel to the sides of the mark pattern 34A.

In the present embodiment, since the exposure by using the mask 10A is performed relative to the thick film resist on the wafer 40A, the circuit pattern 32 is a thick resist pattern. Therefore, there may be a case where a side wall surface of the circuit pattern 32 is not perpendicular to the surface of the wafer. However, the circuit pattern 32 is formed with a desired thick film thickness.

On the other hand, since the pattern occupancy of the mark pattern 34A is adjusted, the mark pattern 34A is a resist pattern thinner than the circuit pattern 32. Therefore, the side wall surface of the mark pattern 34A is substantially perpendicular to the surface of the wafer, and the mark pattern 34A is formed with the desired thin film thickness. The pattern occupancy of the mark 14A is adjusted based on, for example, the film thickness of the thick film resist, the desired film thickness of the mark pattern 34A, and an exposure condition (for example, a photosensitive sensitivity of the resist).

In this way, in the present embodiment, a part of the resist pattern is locally made thinner by adjusting the pattern occupancy of the mark 14A. Accordingly, the rectangularity and the pattern distortion of the mark pattern 34A are improved.

In the semiconductor apparatus according to the present embodiment, the thickness of the film to be processed (processed film), which is stacked on the wafer 40A is, for example, equal to or more than ten times of an exposure wavelength. In this case, for example, the wafer 40A is coated with the thick film resist of equal to or more than 20 times of the exposure wavelength. In other words, the wafer 40A is coated with the thick film resist of which an aspect ratio of the film thickness is equal to or more than 20 times of the exposure wavelength. The exposure is performed by using the mask 10A relative to the thick film resist like this, and the mark pattern 34A of which the aspect ratio of the film thickness is equal to or less than ten times of the exposure wavelength is formed.

After the mark pattern 34A has been formed, an overlap deviation amount between the mark pattern 41 and the mark pattern 34A is measured by an overlap deviation inspection device and the like. In this case, the side wall surface of the mark pattern 34A is perpendicular to the surface of the wafer. In other words, in a case of viewing the mark pattern 34A from the upper surface side, the mark pattern 34A has a symmetrical shape. Therefore, the position of the mark pattern 34A can be accurately measured at the time of measuring the overlap deviation amount. Therefore, the overlap deviation amount between the mark pattern 41 and the mark pattern 34A can be accurately measured.

Next, a structure of the mark pattern 37 will be described with reference to FIG. 4B. The mark pattern 37, the opening pattern 33, and the circuit pattern 35 on the upper layer side are formed at similar positions to those of the mark pattern 34A, the opening pattern 33, and the circuit pattern 32 on the upper layer side, respectively.

The mask 10X includes a substrate 20, a circuit pattern 15, and a mark 16. The mark 16 is formed at a similar position to that of the mark 14A. The mark 16 has a similar pattern occupancy to that of the circuit pattern 15.

When the exposure by using the mask 10X is performed relative to the thick film resist on the wafer 40A, the circuit pattern 35 becomes a thick resist pattern similarly to the circuit pattern 32. Also, since the pattern occupancy of the mark pattern 37 is not adjusted, the mark pattern 37 is a resist pattern having the same thickness as that of the circuit pattern 35. In this way, when the exposure by using the mask 10X is performed, the side wall surfaces of the mark pattern 37 and the circuit pattern 35 are not perpendicular to the surface of the wafer.

After the mark pattern 37 has been formed, the overlap deviation amount between the mark pattern 41 and the mark pattern 37 is measured. In this case, the side wall surface of the mark pattern 37 is not perpendicular to the surface of the wafer. In other words, in a case of viewing the mark pattern 37 from the upper surface side, the mark pattern 37 has an asymmetrical shape. Therefore, an overlap deviation amount measuring device cannot accurately measure the position of the mark pattern 37 when measuring the overlap deviation amount. For example, the center of gravity of the mark pattern 37 is measured as supposed to be deviated according to the effect of the asymmetrical shape. Therefore, a positional deviation is wrongly measured. Therefore, the overlap deviation amount between the mark pattern 41 and the mark pattern 37 cannot be accurately measured.

When mask data of the mask 10A is generated, first data is generated in which a circuit pattern having a first pattern occupancy (transmittance) is arranged on the mask 10A. Also, second data is generated in which the mark 14A having a second transmittance is arranged on the mask 10A. In this case, the second transmittance is adjusted to a value according to the film thickness of the mark pattern 34A.

The thick film resist is used, for example, when the film to be processed arranged on the lower layer side of the resist pattern is thick and when an etching selectivity is not enough. Also, the thick film resist is used in a case where a stacked semiconductor apparatus is formed. In the stacked semiconductor apparatus, there is a stacked semiconductor apparatus in which it is assumed that a gate electrode be a word line (WL) of thin film metal and which has a stacked structure. In the stacked structure, the WL and an interlayer insulating film are alternately stacked. When such a stacked semiconductor apparatus is formed, different kinds of the interlayer insulating films are alternately stacked in a plurality of layers. In a case where such an interlayer insulating film becomes the film to be processed, it is necessary to sufficiently secure a remaining film of the resist pattern after the film to be processed has been processed. Therefore, when a main electrical circuit pattern of the stacked semiconductor apparatus is formed, the thick film resist having a high aspect ratio to process the film to be processed is used.

On the other hand, when a main function of the mark pattern 34A which is insulated from the circuit pattern can be achieved, it is not necessary to form the mark pattern 34A having the same film thickness as that of the electrical circuit pattern. Therefore, in the present embodiment, the rectangularity of the mark pattern 34A is secured by forming the mark pattern 34A to be thin. Accordingly, even when the rectangularity of the resist pattern is deteriorated by the lithography processing and when the distortion of the resist pattern occurs, the mark pattern 34A having a desired shape can be formed.

Also, there is a case where a resist mask of the thin film resist does not have enough etching resistance. In this case, there is a method in which the film to be processed is processed after the resist pattern is transferred to a hard mask such as $SiO_2$ and $Si_3N_4$. In the present embodiment, since it is not necessary to transfer the resist pattern to a hard mask, the number of processes can be reduced.

The mark 14A may be an opening pattern. In this case, a region where the opening pattern 13 is formed is a pattern region where the pattern occupancy is adjusted. Also, the thick film resist of the present embodiment may be a positive resist and a negative resist. Therefore, the mark pattern 34A may be a projection pattern and a recessed pattern.

Also, there may be no circuit pattern 32 around the opening pattern 33. Also, the mark 14A may be a pattern of which a gradation has been adjusted. The mark 14A is not limited to a combination of the line pattern and the space pattern, and the mark 14A may be any patterns. For example, the mark 14A may be a mesh pattern. Also, the mark 14A may be a pattern equal to or lower than the resolution limit and a pattern having a halftone structure.

Also, in the present embodiment, a case has been described in which the mark pattern 34A is used to measure the overlap deviation amount between the mark pattern 34A and the mark pattern on the lower layer side. However, the mark pattern 34A may be used to measure the overlap deviation amount with the mark pattern on the upper layer side.

In this way, in the first embodiment, the wafer 40A coated with the thick film resist is irradiated with the exposure light via the mask 10A. The mask 10A includes the circuit pattern 15 and the mark 14A having a smaller transmittance than that of the circuit pattern 15. When the mask 10A is irradiated with the exposure light, the circuit pattern 32 and the mark pattern 34A are formed on the wafer 40A. The film thickness of the mark pattern 34A is thinner than that of the circuit pattern 15.

In this way, according to the first embodiment, the mark pattern 34A is formed on the wafer 40A by using the mark 14A having the smaller transmittance than that of the circuit pattern 15. Therefore, the mark pattern 34A having a desired shape can be easily formed without being influenced by a surrounding environment of the mark pattern 34A.

Second Embodiment

Next, a second embodiment will be described with reference to FIGS. 5A to 11. In the second embodiment, a mark and an opening pattern are arranged in a region on a mask, and the region is overlapped with an adjacent shot. When an exposure is performed to a wafer, the mark is transferred by a first shot, and the opening pattern is transferred by a second shot. Then, the mark and the opening pattern are superposed.

Figure 5A:
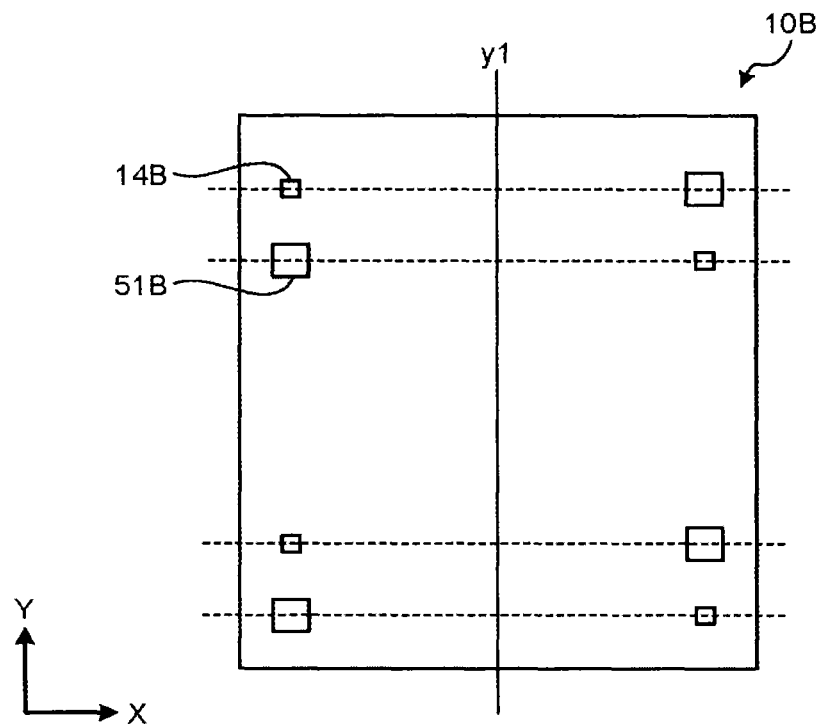
FIGS. 5A and 5B are diagrams of an outline configuration of a mask according to a second embodiment.
Figure 5B:
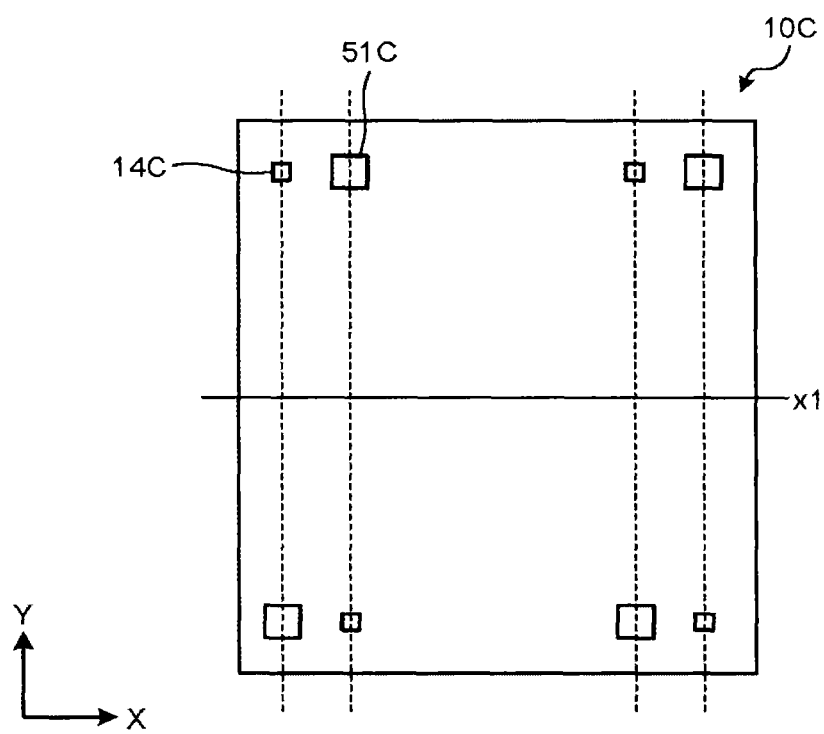

FIGS. 5A and 5B are diagrams of an outline configuration of a mask according to a second embodiment. A configuration of an upper surface of a mask 10B is illustrated in FIG. 5A, and a configuration of an upper surface of a mask 10C is illustrated in FIG. 5B.

A mark 14B and an opening pattern 51B are arranged on the mask 10B. The center region of the mask 10B is a circuit pattern region. The mark 14B is used to form a mark pattern (resist pattern) on a wafer.

A mark 14C and an opening pattern 51C are arranged on the mask 10C. The center region of the mask 10C is a circuit pattern region. The mark 14C is used to form the mark pattern (resist pattern) on the wafer.

The marks 14B and 14C are measurement marks (QC management pattern) to manage QC to be used to perform the exposure to the thick film resist similarly to the mark 14A. Also, in the present embodiment, a case will be described in which the masks 10B and 10C perform the superposition relative to a pattern on the lower layer side.

The marks 14B and 14C are rectangular patterns such as a square. Also, the opening patterns 51B and 51C are patterns of which the pattern occupancies are adjusted. In other words, a part of the regions of the opening patterns 51B and 51C is opened, and other regions are not opened.

Pattern occupancies of the opening patterns 51B and 51C are values according to the thickness of the mark pattern to be formed on the wafer. In other words, the pattern occupancies of the opening patterns 51B and 51C are adjusted so as to form the mark pattern having a desired film thickness. The pattern occupancies of the opening patterns 51B and 51C are adjusted based on, for example, a film thickness of a thick film resist, the film thickness of a desired mark pattern 34B, and an exposure condition (for example, a photosensitive sensitivity of the resist).

The opening pattern 51B is formed to be larger than the mark 14B so that the pattern on the wafer of the mark 14B is placed in the pattern on the wafer of the opening pattern 51B at the time of superposition exposure with the mark 14B. In other words, the opening pattern 51B which includes the mark 14B and is larger than the mark 14B is arranged at the position to be overlapped with the mark 14B.

A plurality of shot exposures is performed relative to the wafer by using the mask 10B or the mask 10C. In this case, the adjacent shots are exposed so that end regions of them are overlapped with each other. Accordingly, the overlapped region between the adjacent shots are exposed twice.

For example, after the first shot has been exposed, the second shot adjacent to the right side (X direction) of the first shot and a third shot adjacent to the upper side (Y direction) of the first shot are exposed. In this case, the exposure is performed so that the right end region of the first shot and the left end region of the second shot are overlapped with each other on the wafer. Also, the exposure is performed so that the upper end region of the first shot and the lower end region of the third shot are overlapped with each other on the wafer.

A pair of the mark 14B and the opening pattern 51B is arranged in the right end region of the mask 10B. Also, a pair of the mark 14B and the opening pattern 51B is arranged in the left end region of the mask 10B.

When the exposure is performed by using the mask 10B, the right end region of the first shot and the left end region of the second shot are overlapped with each other on the wafer. In this case, the mark 14B and the opening pattern 51D are arranged on the mask 10S so that the mark 14B in the right end region and the opening pattern 51B in the left end region are overlapped with each other and the opening pattern 51B in the right end region and the mark 14B in the left end region are overlapped with each other. In other words, the mark 14B and the opening pattern 51B are arranged so that the pair of the mark 14B and the opening pattern 51B in the right end region and the pair of the opening pattern 51B and the mark 14B in the left end region are symmetrical with a line y1 in the Y direction as a symmetrical axis.

Similarly, a pair of the mark 14C and the opening pattern 51C is arranged in the upper end region of the mask 10C. Also, a pair of the mark 14C and the opening pattern 51C is arranged in the lower end region of the mask 10C.

When the exposure is performed by using the mask 10C, the upper end region of the first shot and the lower end region of the third shot are overlapped with each other on the wafer. In this case, the mark 14C and the opening pattern 51C are arranged on the mask 10C so that the mark 14C in the upper end region and the opening pattern 51C in the lower end region are overlapped with each other and the opening pattern 51C in the upper end region and the mark 14C in the lower end region are overlapped with each other. In other words, the mark 14C and the opening pattern 51C are arranged so that the pair of the mark 14C and the opening pattern 51C in the upper end region and the pair of the opening pattern 51C and the mark 14C in the lower end region are symmetrical with a line x1 in the X direction as a symmetrical axis.

The pattern on the wafer according to the opening pattern 51B and the mark 14B is formed on the wafer by performing the superposition exposure to the opening pattern 51B and the mark 14B. In the present embodiment, since both the mark 14B and the opening pattern 51B are exposed relative to a single region, the thickness of the mark pattern on the wafer becomes thinner than that of the circuit pattern.

Figure 6A:
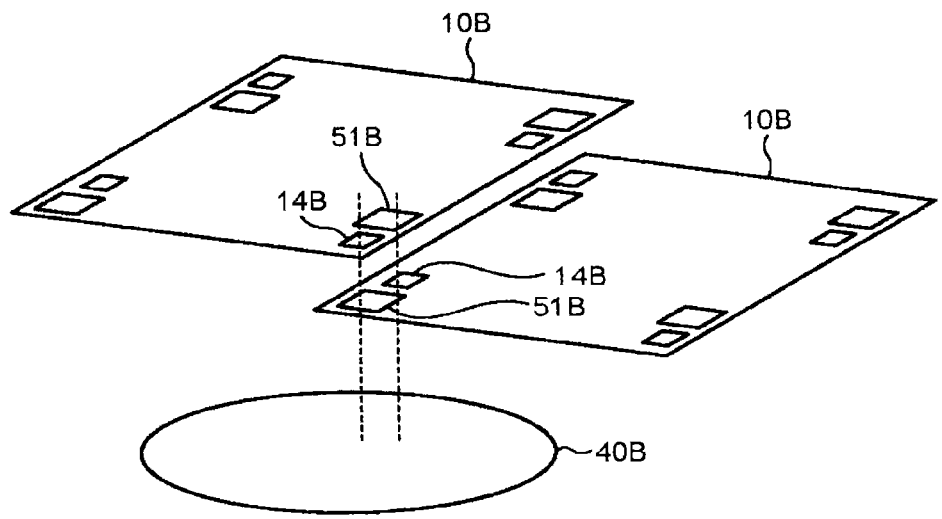
FIGS. 6A and 6B are diagrams to describe a superposition exposure of adjacent shots.
Figure 6B:
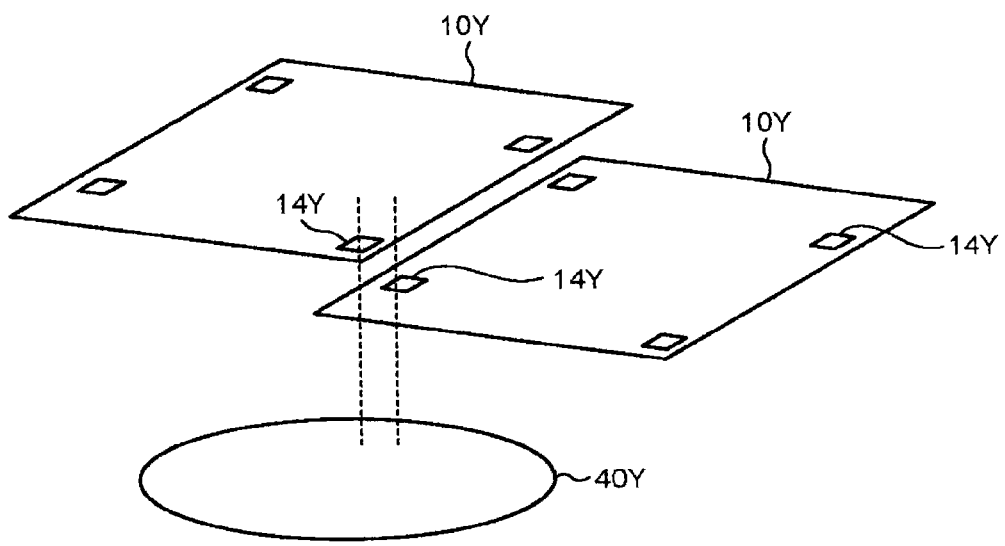

FIGS. 6A and 6B are diagrams to describe a superposition exposure of adjacent shots. A case is illustrated in FIG. 6A in which the superposition exposure is performed to the adjacent shot by using the mask 10B. Also, a case is illustrated in FIG. 68 in which superposition processing to the adjacent shot is performed by using a mask 10Y. The opening patterns 51B and 51C are not arranged on the mask 10Y.

When the superposition processing to the adjacent shot is performed by using the mask 10B, the mark 14B and the opening pattern 51B are irradiated on the wafer 40B by the first shot. The opening pattern 51B is irradiated by the second shot at the position of the mark 14B irradiated by the first shot on the wafer 40B. Similarly, the mark 14B is irradiated by the second shot at the position of the opening pattern 51B irradiated by the first shot on the wafer 40B.

Accordingly, the mark 14B of the first shot and the opening pattern 51B of the second shot are irradiated at a first position on the wafer 40B. Also, the mark 14B of the second shot and the opening pattern 51B of the first shot are irradiated at a second position on the wafer 40B.

Accordingly, the mark patterns having the thinner film thickness than that of the circuit pattern are formed on the first and second shots, respectively. An overlap deviation measurement is performed between the first shot and the shot arranged on the lower layer side of the first shot, and an overlap deviation measurement is performed between the second shot and the shot arranged on the lower layer side of the second shot. Therefore, an overlap deviation measurement is performed between the mark pattern of the first shot and the mark pattern arranged on the lower layer side of the first shot. Also, an overlap deviation measurement is performed between the mark pattern of the second shot and the mark pattern arranged on the lower layer side of the second shot.

Also, when the superposition processing to the adjacent shot is performed by using the mask 10Y, the mark 14Y is irradiated on a wafer 40Y by the first and second shots. Accordingly, two marks 14Y are irradiated in the superposition region on the wafer 40Y.

FIG. 7 is a diagram to describe a shape of a mark pattern according to the second embodiment. The mark pattern according to the second embodiment may be a projection pattern and a recessed pattern. Here, a case will be described in which the mark pattern is the recessed pattern (opening pattern). Also, the mark pattern formed by using the mask 10B has the similar shape to that of the mark pattern formed by using the mask 10C. Therefore, here, a case will be described in which the mark pattern is formed by using the mask 10B.

When the adjacent shots are superposed in exposure processing performed by using the mask 10B, the mark pattern 34B is formed in a mark forming region 60A on the wafer 40B. In the mark forming region 60A, the mark pattern 34B is formed in the center region, and a resist pattern 61A is formed in an outer peripheral region.

Also, when the adjacent shots are superposed by the exposure processing using the mask 10Y, a mark pattern 34Y is formed in a mark forming region 60Y on the wafer 40Y. In the mark forming region 60Y, the mark pattern 34Y is formed in the center region, and the resist pattern 61Y is formed in the outer peripheral region.

For example, the mark pattern 34Y to be formed by the exposure processing using the mask 10Y has the same thickness (depth) H1 as that of the other circuit pattern. Whereas, the mark pattern 34B to be formed by the exposure processing using the mask 10B has a thickness H2 thinner than the thickness H1. In other words, the thickness of the mark pattern 34B becomes thinner than that of the other circuit pattern.

Figure 8:
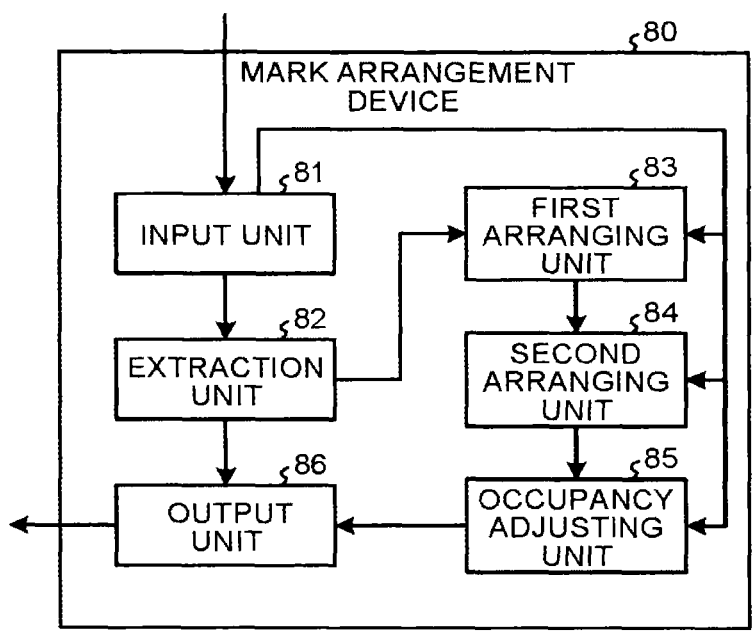
FIG. 8 is a diagram of a configuration of a mark arrangement device according to the second embodiment.

Next, a structure of a mark arrangement device which arranges the mark 14B and the opening pattern 5B on the mask 10B will be described. FIG. 8 is a diagram of a configuration of a mark arrangement device according to the second embodiment;

A mark arrangement device 80 is a computer and the like which arranges the mark 14B and the opening pattern 51B in a pattern arranging region on the mask 10B. The mark arrangement device 80 includes an input unit 81, an extraction unit 82, a first arranging unit 83, a second arranging unit 84, an occupancy adjusting unit 85, and an output unit 86.

Pattern data of the mark 143, pattern data of the opening pattern 51B, shot map data of the mask 10B, mark pattern information regarding the mark pattern 34B, and the like are input to the input unit 81. The shot map data of the mask 10B includes information regarding the superposition region where the adjacent shots are superposed. The information regarding the superposition region is a position (coordinate) of the superposition region and the like.

Also, the mark pattern information includes characteristics of the thick film resist (for example, resist solubility characteristics, resist sensitivity, and resist film thickness) which is used when the mark pattern 34B is formed, the film thickness to be set to the mark pattern 34B and the like. Also, the mark pattern information includes an exposure condition (exposure amount and focus) in a case where the mark pattern 343 (circuit pattern) is formed.

The input unit 81 transmits the input shot map data to the extraction unit 82. Also, the input unit 81 transmits the pattern data of the mark 143 to the first arranging unit 83 and transmits the pattern data of the opening pattern 5B to the second arranging unit 84. Also, the input unit 81 transmits the mark pattern information to the occupancy adjusting unit 85.

The extraction unit 82 extracts the superposition region from the shot map based on the shot map data. The extraction unit 82 transmits the extracted superposition region to the first arranging unit 83. Also, the extraction unit 82 transmits the shot map data to the output unit 86.

The first arranging unit 83 arranges the mark 143 in the superposition region based on the pattern data of the mark 143 and the superposition region. The first arranging unit 83 transmits the superposition region where the mark 143 has been arranged to the second arranging unit 84.

The second arranging unit 84 arranges the opening pattern 51B in the superposition region based on the pattern data of the opening pattern 51B and the superposition region. The second arranging unit 84 arranges the opening pattern 5B so that the mark pattern 34B of the mark 14B and the mark pattern of the opening pattern 51B are overlapped with each other on the wafer 40B when the superposition exposure is performed to the first and second shots. The second arranging unit 84 transmits the superposition region where the mark 14B and the opening pattern 51B have been arranged to the occupancy adjusting unit 85.

The occupancy adjusting unit 85 adjusts the pattern occupancy of the opening pattern 51B based on the mark pattern information. The occupancy adjusting unit 85 adjusts the pattern occupancy of the opening pattern 51B so that the mark pattern 34B has the film thickness which is set in the mark pattern information. The occupancy adjusting unit 85 transmits the superposition region in which the pattern occupancy of the opening pattern 51B has been adjusted to the output unit 86.

The output unit 86 outputs the shot map data, in which the superposition region has been arranged, from the occupancy adjusting unit 85 to an external device (exposure device and the like). In the superposition region arranged in the shot map data to be output, the mark 14B and the opening pattern 51B of which the pattern occupancy has been adjusted are arranged.

The pattern data of the mark 14B and the pattern data of the opening pattern 51B may be previously stored in the mark arrangement device 80. Also, the input of the shot map data to the mark arrangement device 80 may be omitted. In this case, the information regarding the superposition region is input to the mark arrangement device 80. Also, the mark arrangement device 80 may arrange the mark 14C and the opening pattern 51C on the mask 10C.

Figure 9:
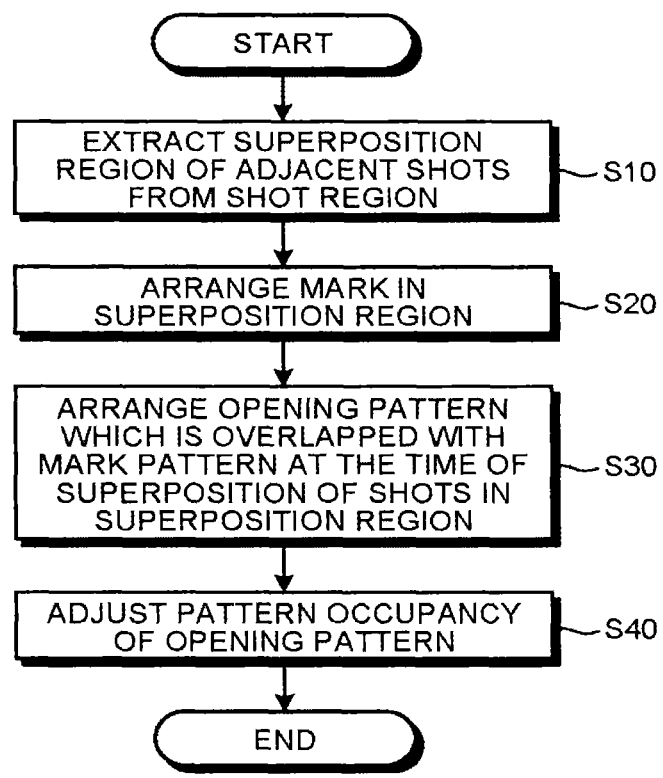
FIG. 9 is a flowchart of a processing procedure of mark arrangement processing according to the second embodiment.

Next, a processing procedure of processing to arrange the mark 14B and the opening pattern 51B on the mask 10B will be described. FIG. 9 is a flowchart of a processing procedure of mark arrangement processing according to the second embodiment.

The pattern data of the mark 14B, the pattern data of the opening pattern 51B, the shot map data of the mask 10B, the mark pattern information regarding the mark pattern 34B, and the like are input to the input unit 81 of the mark arrangement device 80.

The extraction unit 82 extracts the superposition region from the shot map based on the shot map data (step S10). The first arranging unit 83 arranges the mark 14B in the superposition region based on the pattern data of the mark 14B and the superposition region (step S20).

The second arranging unit 84 arranges the opening pattern 51B in the superposition region based on the pattern data of the opening pattern 51B and the superposition region. The second arranging unit 84 arranges the opening pattern 51B so that the mark pattern 34B of the mark 14B and the mark pattern of the opening pattern 51B are overlapped with each other on the wafer 40B when the superposition exposure is performed to the first and second shots. In other words, the second arranging unit 84 arranges the opening pattern 51B, which is overlapped with the mark pattern 34B at the time of the superposition of the shots, in the superposition region (step S30).

The occupancy adjusting unit 85 adjusts the pattern occupancy of the opening pattern 51B based on the mark pattern information (step S40). The occupancy adjusting unit 85 adjusts the pattern occupancy (transmittance of exposure light) of the opening pattern 51B so that the mark pattern 34B has the film thickness set in the mark pattern information. The output unit 86 outputs the shot map data where the superposition region has been arranged from the occupancy adjusting unit 85 to the external device.

Figure 10:
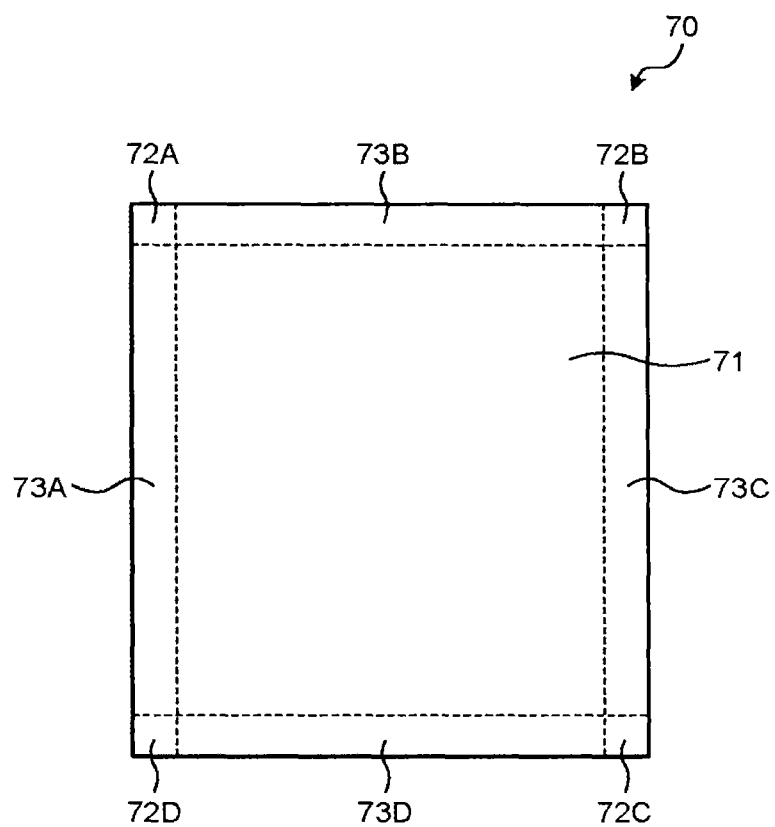
FIG. 10 is a diagram to describe a superposition region with the adjacent shot.

FIG. 10 is a diagram to describe a superposition region with the adjacent shot. A top view of a shot region 70 of the mask 10B is illustrated in FIG. 10. In the shot region 70, a center region 71 where the circuit pattern and the like is arranged and superposition regions 72A to 72D and 73A to 73D where the superposition exposure with the adjacent shot is performed.

The superposition region 72A is an upper left part of the shot region 70, and the superposition region 72B is an upper right part of the shot region 70. The superposition region 72C is a lower right part of the shot region 70, and the superposition region 72D is a lower left part of the shot region 70.

Also, the superposition region 73A is a part where the superposition regions 72A and 72D are removed from the left end part of the shot region 70. The superposition region 73B is a part where the superposition regions 72A and 72D are removed from the upper end part of the shot region 70. The superposition region 73C is a part where the superposition regions 72B and 72C are removed from the right end part of the shot region 70. The superposition region 73D is a part where the superposition regions 72C and 72D are removed from the lower end part of the shot region 70.

In the present embodiment, for example, the marks 14B and the opening patterns 51B are arranged in the superposition regions 73A to 73D. For example, when the mark 14B has been arranged in the superposition region 73A, the opening pattern 51B is arranged in the superposition region 73C opposed to the superposition region 73A. Similarly, when the mark 14B has been arranged in the superposition region 73C, the opening pattern 51B is arranged in the superposition region 73A opposed to the superposition region 73C.

The marks 14B and the opening patterns 51B may be arranged in the superposition regions 72A to 72D. In the superposition regions 72A to 72D, the superpositions with the adjacent shot are performed three times. For example, in the superposition region 72A, the superpositions are performed between the superposition region 72D with the adjacent shot on the upper side, the superposition region 72C with the adjacent shot on the upper left side, and the superposition region 72B with the adjacent shot on the right side. Therefore, when the mark 14B is arranged in each superposition regions 72A to 72D, the pattern occupancy of the opening pattern 51B is adjusted so as to form the mark pattern 34B with the thin film by three-time superpositions.

For example, when the mark 14B is arranged in the superposition region 72A, the opening pattern is arranged in at least one of the superposition regions 72B to 72D. In this case, the pattern occupancy according to the number of times of the superposition is set to the opening pattern.

When the opening pattern 51B is arranged in a single superposition region, the pattern occupancy similar to that of the opening pattern 51B arranged in each of the superposition regions 73A to 73D is set. When the opening patterns 51C and 51B (not shown) are arranged in two superposition regions, the pattern occupancies of the opening patterns 51C and 51D are set so that the transmittance becomes similar to that of the opening pattern 51B by superposing the opening patterns 51C and 51D. Similarly, when opening patterns 51E to 51G (not shown) are arranged in three superposition regions, the pattern occupancies of the opening patterns 51E to 51G are set so that the transmittance becomes similar to that of the opening pattern 51B by superposing the opening patterns 51E to 51G.

Figure 11:
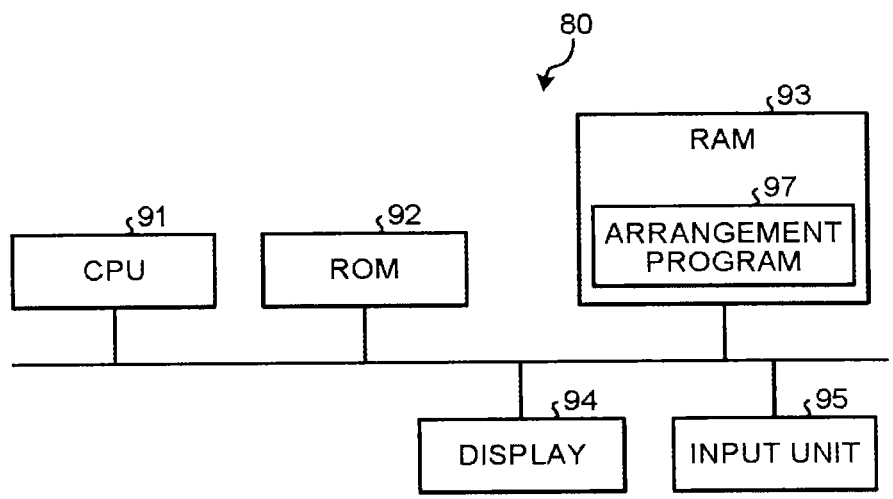
FIG. 11 is a diagram of a hardware configuration of the mark arrangement device.

Next, a hardware configuration of the mark arrangement device BO will be described. FIG. 11 is a diagram of the hardware configuration of the mark arrangement device. The mark arrangement device 80 includes a central processing unit (CPU) 91, a read only memory (ROM) 92, a random access memory (RAM) 93, a display 94, and an input unit 95. In the mark arrangement device 80, the CPU 91, the ROM 92, the RAM 93, the display 94 and the input unit 95 are connected to each other via a bus line.

The CPU 91 arranges the mark 14B and the opening pattern 51B by using an arrangement program 97 which is a computer program. The arrangement program 97 is a computer program product which can be executed by a computer and has a nontransitory computer readable recording medium including a plurality of commands to arrange the mark 14B and the opening pattern 5B. In the arrangement program 97, the plurality of commands makes the computer arrange the mark 14B and the opening pattern 51B.

The display 94 is a display device such as a liquid crystal monitor and displays the shot map, the mark 14B arranged in the superposition region, the opening pattern 51B and the like based on an instruction from the CPU 91. The input unit 95 includes a mouse and a keyboard and inputs instruction information (necessary parameter for arranging the mark 14B and the opening pattern 51B and the like) input from outside by a user. The instruction information input to the input unit 95 is transmitted to the CPU 91.

The arrangement program 97 is stored in the ROM 92 and is loaded to the RAM 93 via the bus line. A state where the arrangement program 97 has been loaded to the RAM 93 is illustrated in FIG. 11.

The CPU 91 executes the arrangement program 97 which has been loaded in the RAM 93. Specifically, in the mark arrangement device 80, the CPU 91 reads the arrangement program 97 from the ROM 92, develops it in a program storing region in the RAM 93 and executes various kinds of processing according to an instruction input from the input unit 95 by the user. The CPU 91 temporarily stores various kinds of data generated at the time of various kinds of processing in a data storing region to be formed in the RAM 93.

The arrangement program 97 executed by the mark arrangement device 80 has a module configuration including the extraction unit 82, the first arranging unit 83, the second arranging unit 84, and the occupancy adjusting unit 85. These are loaded to a main storage device, and these are generated in the main storage device.

When the semiconductor apparatus is manufactured, a film to be processed is stacked on the wafer 40B. The film to be processed is, for example, a layer to be a word line used in a stacked memory and an interlayer insulating film. After the film to be processed has been stacked, the film to be processed is coated with the thick film resist. After that, the exposure processing is performed to the thick film resist by using the mask 10B. In addition, developing processing is performed to the wafer. Accordingly, the circuit pattern, the mark pattern 34B, and the like by using the thick film resist are formed on the wafer 40B. When a pattern is formed on the wafer, processing for forming a film, lithography processing, etching processing, and the like is performed. When the semiconductor apparatus is manufactured, the processing for forming a film, the lithography processing, the etching processing, and the like is repeated in each layer.

In this way, in the second embodiment, the mark data of the opening pattern 51B and the mark 14B is generated. The opening pattern 51B and the mark 14B are arranged on the mask 10B so that the opening pattern 51B and the mark 14B are overlapped with each other in the superposition region. In addition, the transmittance of the opening pattern 51B is adjusted to a value according to the film thickness of the mark pattern 34B.

In this way, according to the second embodiment, the mark pattern 34B is formed on the wafer 40B by using the opening pattern 51B according to the film thickness of the mark pattern 34B. Therefore, the mark pattern 34B having a desired shape can be easily formed without being influenced by a surrounding environment of the mark pattern 34B.

Also, the number of times of the superpositions of the mark 14B and the opening pattern 51B can be selected by adjusting arranged positions of the mark 14B and the opening pattern 51B on the mask 10B.

Also, the mark 14B and the opening pattern 51B may be arranged at any positions in the superposition regions 72A to 72D and 73A to 73D. Accordingly, the mark 14B and the opening pattern 51B can be arranged at various positions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a mark pattern comprising:
    coating a film to be processed on a substrate with a photosensitive film;
    irradiating the photosensitive film with exposure light via a mask, the mask including a first mask pattern region and a second mask pattern region, the first mask pattern region being a region in which a first circuit pattern is arranged, the first circuit pattern having a first transmittance, the second mask pattern region being a region in which the mark pattern to be used to measure a superposition between films is arranged, the mark having a second transmittance;
    developing the photosensitive film so that the first circuit pattern and the mark pattern are transferred to the photosensitive film, the transferred first circuit pattern having a first film thickness, the transferred mark pattern having a second film thickness, the second film thickness being thinner than the first film thickness.

2. The method of forming a mark pattern according to claim 1, wherein
    the mark pattern is formed on the substrate by using gray scale lithography.

3. The method of forming a mark pattern according to claim 1, wherein
    first pattern occupancy of a light shielding portion of the mark pattern is lower than second pattern occupancy of a light shielding portion of the first circuit pattern.

4. The method of forming a mark pattern according to claim 1, wherein
    the second film thickness has an aspect ratio of equal to or less than ten times relative to a wavelength of the exposure light.

5. The method of forming a mark pattern according to claim 1, wherein
    the film to be processed is a film to be used for a stacked semiconductor apparatus.

6. The method of forming a mark pattern according to claim 1, wherein
    the mark pattern is formed in a scribe area on the substrate.

7. The method of forming a mark pattern according to claim 1, wherein
    the mark pattern is a pillar pattern having a rectangular upper surface.

* * * * *